United States Patent [19]

Harris

[11] 3,760,287

[45] Sept. 18, 1973

[54] DIGITALLY CONTROLLABLE VARIABLE ACTIVE RC FILTER

[75] Inventor: Cliff Andrew Harris, Holmdel, N.J.

[73] Assignee: Bell Telephone Laboratories, Incorporated, Murray Hill, N.J.

[22] Filed: Aug. 28, 1971

[21] Appl. No.: 172,717

[52] U.S. Cl. .......................... 330/9, 330/51, 330/99

[51] Int. Cl. .......................... H03f 1/02

[58] Field of Search .......................... 330/51, 9, 35, 99

[56] References Cited

UNITED STATES PATENTS

| | | | |
|---|---|---|---|
| 3,504,521 | 4/1970 | Luckers | 73/1 |
| 3,534,274 | 10/1970 | Robinson | 328/164 |
| 3,495,233 | 2/1970 | Saari | 340/174 |
| 3,621,412 | 11/1971 | Keeling et al. | 330/107 |

*Primary Examiner*—Nathan Kaufman
*Attorney*—W. L. Keefauver

[57] ABSTRACT

The several transmission characteristics of an active RC filter are adjusted by digital control of passive networks included at particular points in the filter circuit. Each network includes a plurlaity of passive circuit elements connected either in series or in parallel, each circuit element having a switching element in circuit relation thereto for selectively preventing current from flowing in the associated circuit element. Each switching element is uniquely controlled by the logical condition of a predetermined place of a binary control quantity. The values of the elements in a given network are related by a geometric progression such that the filter characteristic controlled by that network varies linearly with the associated binary control quantity.

23 Claims, 5 Drawing Figures

DIGITALLY CONTROLLABLE VARIABLE ACTIVE RC FILTER

BACKGROUND OF THE INVENTION

1. Field of the Invention

This invention relates to the filtering of electrical signals and more particularly to active RC filter networks.

2. Description of the Prior Art

Inductorless filters (i.e., filters whose passive components include only resistors and capacitors to the exclusion of inductors) have become increasingly important with the development of integrated circuit technology. Since inductors are not conveniently realized in integrated circuits, the advantages of integrated circuit technology are most completely realized in the fabrication of networks which do not include inductors. In the case of filters, it has long been known that a wide variety of filter transfer functions can be realized using only resistors, capacitors, and operational amplifiers. Such filters are known as active RC filters. Active RC filters are discussed, for example, in "Sensitivity — Key to Analog Active Filters," *Electronics Design News*, Nov. 1, 1970, pp. 17–25 and in "Active Filters: New Tools For Separating Frequencies" by L. C. Thomas, *Bell Laboratories Record*, Vol. 49, No. 4, Apr. 1971, pp. 121–125.

Among the advantages of active RC filters is the ease with which the transmission characteristics of such filters can be varied simply by varying the resistances and/or capacitances in the network. Active RC filters are therefore of potential use in applications involving transmission system testing and signal analysis in general (e.g., signal spectrum analysis). To be useful in such applications, however, the characteristics of a filter network must be variable over a considerable range with considerable precision. In addition, such filters are preferably electronically controlled so that they may be employed to realize a predetermined sequence of filter functions automatically as is required, for example, in a signal spectrum analyzer. Finally, digital control of such filter networks is desirable since such control makes possible more precise, highly reproducible adjustment of the network. Digitial control also renders the network suitable for control by digital computing machinery as is advantageous in the realization of programmable filters generally.

It is therefore an object of this invention to provide active RC filter apparatus, the characteristics of which are adjustable over a wide range with any degree of precision.

It is another object of this invention to provide digitally controlled, variable active RC filter networks.

It is another object of this invention to provide digitally programmable active RC filter apparatus.

It is yet another object of this invention to perform automatic signal spectrum analysis by means of active RC filter apparatus.

It is a more particular object of this invention to provide active RC filter apparatus, the characteristics of which can be varied linearly with one or more digital control quantities.

SUMMARY OF THE INVENTION

These and other objects of this invention are accomplished, in accordance with the principles of this invention, by employing digitally controlled networks of passive circuit elements (i.e., resistors or capacitors) in place of selected resistors or capacitors in an active RC filter. Each network of passive circuit elements includes either a plurality of resistors or a plurality of capacitors connected either in series or in parallel. Each network further includes a plurality of switching elements, one of which is associated with each resistor or capacitor in the network for selectively preventing current from flowing in the associated resistor or capacitor. Each switching element is uniquely controlled by the logical condition of a predetermined place of a binary control quantity. The term "place of a binary quantity" is used herein to denote the digit positions within a binary number. That is, each digit within a binary number represents a characteristic value of the modulo 2 ($2^0$, $2^1$, $2^2$, ... etc.). Thus each digit within a binary number is said to occupy a "place" within the binary number. The values of the resistors or capacitors in each network are related by a geometric progression such that the filter characteristic or characteristics controlled by that network vary linearly with the associated binary control quantity.

Further features and objects of this invention, its nature, and various advantages will be more apparent upon consideration of the attached drawing and the following detailed description.

DETAILED DESCRIPTION OF THE INVENTION

Figure 1:
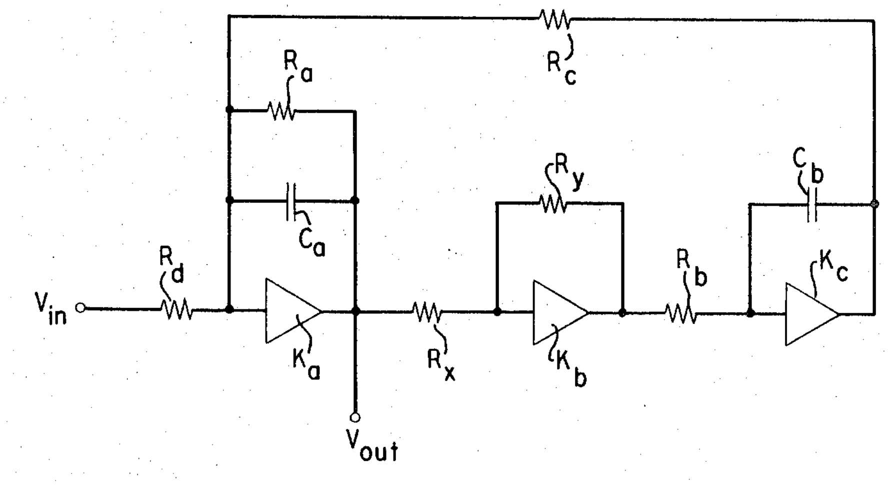
FIG. 1 PRIOR ART
FIG. 1 is a schematic diagram of a well-known, second-order, bandpass, active RC filter.

The active RC filter shown in FIG. 1 is the bandpass portion of the well-known general second-order active RC filter (compare, for example, the figure on page 124 of the article by L. C. Thomas cited above). A bandpass filter is, of course, one which substantially attenuates all signal frequencies other than those in the pass band of the filter. The network of FIG. 1 comprises amplifiers $K_a$, $K_b$, and $K_c$, resistors $R_a$, $R_b$, $R_c$, $R_d$, $R_x$, and $R_y$, and capacitors $C_a$ and $C_b$ connected as shown. Amplifiers $K_a$, $K_b$, and $K_c$ are operational amplifiers of any well-known type. The noninverting input terminal of each amplifier (not shown) is connected to ground in the customary manner.

The transfer function of the active RC filter of FIG. 1 is as follows:

$$T(s)=\frac{V_{out}}{V_{in}}(s)=\frac{-\frac{1}{R_dC_a}s}{s^2+\frac{1}{R_aC_a}s+\frac{R_y}{R_xR_bR_cC_aC_b}} \quad (1)$$

where $s$ is the complex variable. As is well known, the roots of the quadratic expression in the denominator of equation (1) are the so-called poles of the filter transfer function. The poles of the transfer function determine the bandpass characteristics of th fi'ter. Thus the frequency at the center of the pass band is given by $$\omega_p = \sqrt{R_y} / \sqrt{R_x R_b R_c C_a C_b} \ . \tag{2}$$

Similarly, the width of the pass band, defined as the separation (in radians per second) between the frequencies at which the voltage magnitude response of the filter is 3 dB below its peak value, is given by $$BW = 1/R_a C_a \ . \tag{3}$$

Finally, the gain of the filter at $\omega_p$ (i.e., the peak gain of the filter) is given by $$|T(j\omega_p)| = R_a/R_d. \tag{4}$$

It will be evident from equations (2), (3), and (4) that the several principal characteristics of the bandpass active RC filter network of FIG. 1 can be varied by varying the values of selected resistors and capacitors in the network. For example, $\omega_p$, the center frequency of the filter, can be varied by varying any or all of resistors $R_b$, $R_c$, $R_x$, and $R_y$ and capacitors $C_a$ and $C_b$. It will be observed that of these variables, $R_b$, $R_c$, $R_x$, $R_y$ and $C_b$ appear only in equation (2). $\omega_p$ can therefore be varied independently (i.e., without change in bandwidth or peak gain) by varying one or more of these latter variables. As is discussed in greater detail below, variation of center frequency without change in bandwidth or peak gain is appropriate to application of the filter of FIG. 1 as a signal spectrum analyzer.

Just as $\omega_p$ can be varied as discussed above, the bandwidth of the filter can be adjusted by varying either $R_a$ or $C_a$. If $R_a$ is varied for this purpose, then there will be no concurrent change in $\omega_p$, whereas if $C_a$ is varied, there will be no concurrent change in peak gain. Similarly, peak gain can be adjusted by varying either $R_a$ or $R_d$. If $R_d$ is varied, there will be no concurrent change in center frequency or bandwidth.

The principles of this invention are applicable to the variation of any of the resistors and capacitors of active RC filter networks generally and of the filter network of FIG. 1 in particular. In accordance with the objects of this invention, however, it is advantageous that the resistors and/or capacitors chosen for variation be such that the affected filter characteristic or characteristics vary linearly with one or more digital control quantities. This, of course, results in the simplest, most straightforward control relationships. In the case of the bandwidth of the filter of FIG. 1, for example, increased bandwidth results from increasing the reciprocal of either $R_a$ or $C_a$ (see equation (3)). Thus the desired linear relationship between bandwidth and a control quantity will result if the control quantity is linearly related to the reciprocal of either $R_a$ or $C_a$. Similarly, the peak gain of the filter of FIG. 1 can be increased by increasing either $R_a$ or the reciprocal of $R_d$ (see equation (4)). A linear relationship between peak gain and a control quantity will result if the control quantity is linearly related to $R_a$ or the reciprocal of $R_d$. In the case of $\omega_p$ for the filter of FIG. 1, control of the square root of $R_y$ or the reciprocal of the square root of $R_x$, $R_b$, $R_c$, $C_a$, or $C_b$ such that the controlled quantity varies linearly with the control quantity will produce the desired linear relationship between $\omega_p$ and the control quantity. Alternatively, setting any two of the variables in the denominator of equation (2) equal and varying the reciprocal of those two quantities linearly with a single control quantity will result in the desired linear relationship between $\omega_p$ and the control quantity. This avoids the complication of the square roots. Thus setting $R_b = R_c = R$, for example, allows equation (2) to be rewritten as follows:

$$\omega_p = \sqrt{R_y}/R\sqrt{R_x C_a C_b} \tag{5}$$

The desired linear relationship between $\omega_p$ and a control quantity is therefore achieved by varying the reciprocal of $R_b$ and the reciprocal of $R_c$ linearly with the control quantity.

In summary, linear control of three kinds of passive circuit element variables has been mentioned. These three kinds of variables are (*a*) resistance (as in the case of $R_a$ in control of peak gain), (*b*) the reciprocal of resistance (as in the case of $R_d$ in control of peak gain), and (c) the reciprocal of capacitance (as in the case of $C_a$ in control of bandwidth). In addition, any two resistances in the denominator of equation (2) can be set equal and varied simultaneously in the manner of variables of type (*b*) above to produce linear variation of $\omega_p$. Alternatively, $C_a$ and $C_b$ can be set equal and varied simultaneously in the manner of variables of type (*c*) with the same effect on $\omega_p$.

Figure 2:
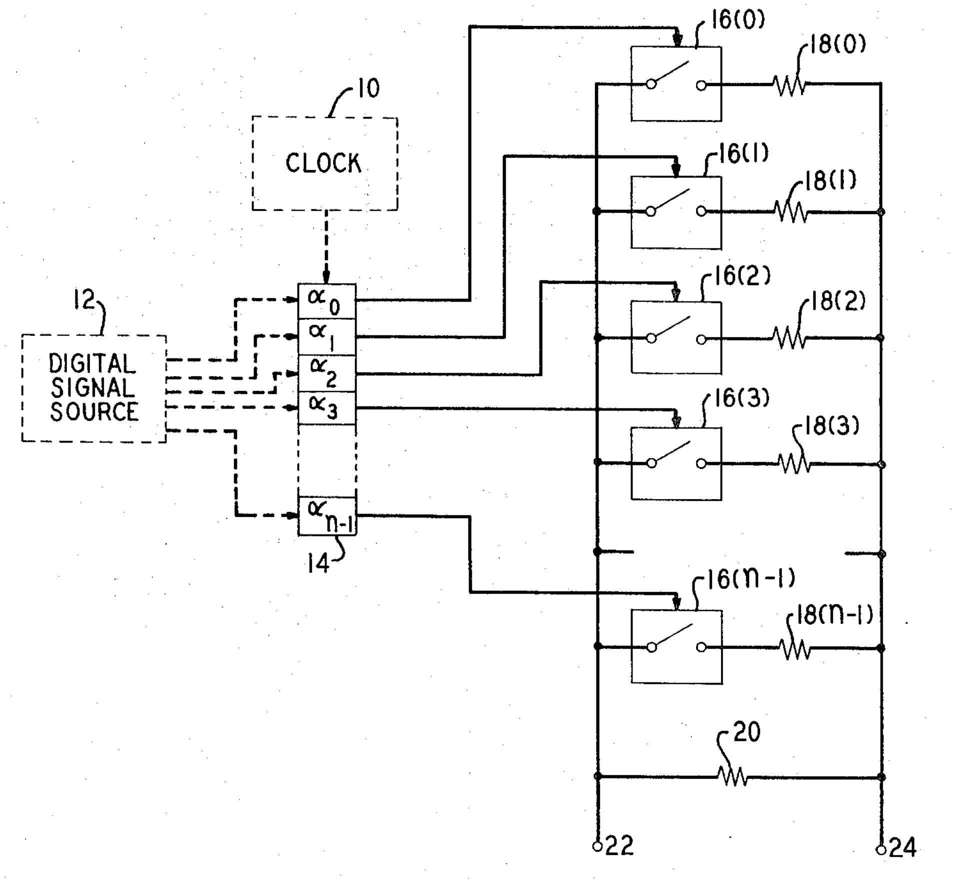
FIG. 2 is a schematic diagram of a digitally controlled resistive network for use in active RC filters constructed in accordance with the principles of this invention.

FIG. 2 illustrates a digitally controlled resistive network, constructed in accordance with the principles of this invention, which has a net resistance the reciprocal of which varies linearly with a binary digital control quantity. Accordingly, such networks are suitable for replacing $R_b$ and $R_c$ in the filter of FIG. 1 to produce linear variation of $\omega_p$ with the control quantity. The network of FIG. 2 is also suitable for replacing $R_a$ or $R_d$ in the filter of FIG. 1 to produce linear variation of either bandwidth or peak gain, respectively.

The resistive network of FIG. 2 comprises a plurality of circuit branches connected in parallel between terminals 22 and 24. With the exception of the circuit branch including resistor 20, each circuit branch in the resistive network if FIG. 2 includes a paired or associated switch 16 and resistor 18. Each of switches 16 may be any suitable electromechanical or electronic switch. For example, field effect transistor (FET) switches have proved satisfactory.

The resistive network of FIG. 2 is controlled by multistage binary register 14. Depending on the desired capabilities of the active RC filter apparatus, binary register 14 may be either a binary counter for maintaining a binary count of signal pulses from clock 10 or it may be a storage register for storing a binary signal quantity generated by binary signal source 12 (e.g., a general purpose digital computer). In any event, register 14 includes $n$ stages, each storing one binary place of a binary control quantity. As is well known, the several places of such a quantity have numerical significance $2^0, 2^1, 2^2, 2^3, \ldots, 2^{n-1}$. The decimal value of such a quantity is therefore given by the expression $$\alpha = \sum_{i=0}^{i=n-1} \alpha_i 2^i \qquad (6)$$

where each $\alpha_i$ is either zero or one. For convenience it will be assumed that the several stages of register 14 are arranged in order of numerical significance from least significant ($2^0$) at the top of register 14 as viewed in FIG. 2 to most significant ($2^{n-1}$) at the bottom of register 14.

Each stage of register 14 and hence each place of the binary control quantity stored herein is uniquely associated with one of switches 16(0) through 16(n-1). More particularly, each of switches 16(0) through 16(n-1) is controlled by the logical condition of the corresponding stage of register 14 (i.e., stages having significance $2^0$ through $2^{n-1}$, respectively). Each switch is closed when the corresponding stage of register 14 is logical one and open when the corresponding stage of register 14 is logical zero.

In accordance with the objects of this invention, it is desired that the reciprocal of the resistance of the resistive network of FIG. 2 vary linearly with the control quantity in register 14. Since the reciprocal of the resistance of a network of parallel resistors is given by the sum of the reciprocals of the individual resistances, the reciprocal of the resistance of the network of FIG. 2 is given by $$1/R_t = 1/R_{fixed} + \alpha_0/R_0 + \alpha_1/R_1 + \alpha_2/R_2 + \ldots + \alpha_{n-1}/R_{n-1} \qquad (7)$$

where $R_{fixed}$ is the value of resistor 20, the $\alpha_i$ are the binary switching functions defined above, and $R_0$ through $R_{n-1}$ are the values of resistors 18(0) through 18($n$—1), respectively. The desired linear variation of $1/R_t$ is achieved, in accordance with the principles of this invention by the appropriate selection of values for resistors 18(0) through 18($n$—1), i.e., by appropriate choice of $R_0$ through $R_{n-1}$. In particular, let each $R_i$ be related to $R_0$ by the following equation:

$$R_i = (\tfrac{1}{2})^i R_0 = R_0/2^i \quad \text{for} \quad 1 \leq i \leq n-1. \qquad (8)$$

Equation (8), of course, means that each of the resistances $R_i$ is half as large as the preceding resistance $R_{i-1}$. Accordingly, the $R_i$ are related by a geometric progression starting with $R_0$ and having ratio one-half (i.e., ½).

Substituting equation (8) into equation (7) yields:

$$1/R_t = 1/R_{fixed} + \alpha_0/R_0 + 2\alpha_1/R_0 + 2^2\alpha_2/R_0 + \ldots + 2^{n-1}\alpha_{n-1}/R_{0\,(e)} \qquad (9)$$

or in a more compact notation:

$$\frac{1}{R_t} = \frac{1}{R_{fixed}} + \frac{1}{R_0}\sum_{i=0}^{i=n-1} \alpha_i 2^i \qquad (10)$$

As is evident from equation (6), however, $$\sum_{i=0}^{i=n-1} \alpha_i 2^i$$

is just the decimal value of the binary control quantity stored in register 14 and responsive to which switches 16(0) through 16($n$—1) operate. Accordingly, from a minimum initial value determined by $1/R_{fixed}$, $1/R_t$ varies linearly upward with the binary control quantity stored in register 14. The proportional constant relating $1/R_t$ and the binary control quantity is, of course, $1/R_0$, the reciprocal of the value of the largest of resistors 16. Selection of $R_0$ through $R_{n-1}$ according to the geometric progression defined by equation (8) therefore leads to the desired linearity between $1/R_t$ and the digital control quantity in register 14.

It will be evident that linear variation of $1/R_t$ over any range with any degree of precision can be realized by choosing a sufficiently large value of $n$. Increased $n$ can be used to extend the range of variation of $1/R_t$ or to enable the adjustment of $1/R_t$ in smaller increments or both. Smaller increments results from increasing $R_0$, thereby decreasing the proportional constant $1/R_0$. The smaller the incremental adjustment $1/R_0$, the more precisely $1/R_t$ can be adjusted.

Figure 3:
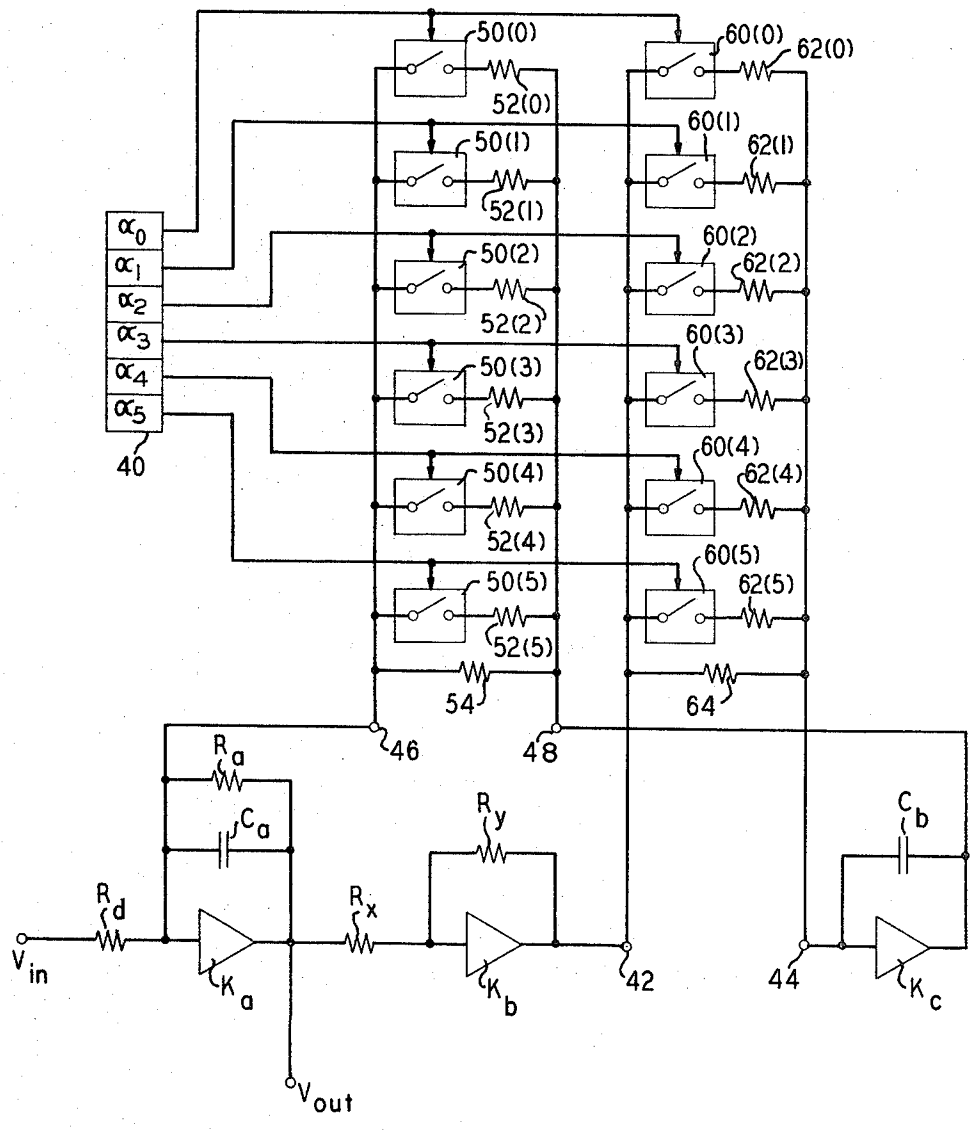
FIG. 3 is a schematic diagram of a digitally controlled, variable, second-order, bandpass, active RC filter constructed in accordance with the principles of this invention.

FIG. 3 shows the active RC filter network of FIG. 1 with $R_b$ and $R_c$ each replaced by resistive networks of the type shown in FIG. 2. In particular, $R_b$ is replaced by the resistive network connecting terminals 42 and 44 and $R_c$ is replaced by the resistive network connecting terminals 46 and 48. Both resistive networks are controlled in tandem by six-stage binary register 40. In order that $R_b = R_c = R$ at all times as is required for linear variation of $\omega_p$ with the control quantity in register 40 (see equation (5)), all corresponding components in the two resistive networks are identical. Thus resistors 54 and 64 are identical. Similarly, resistors 52(0) through 52(5) are respectively identical to resistors 62(0) through 62(5). The resistances of these two networks therefore vary identically, the reciprocal of each resistance, $1/R$, varying linearly with the control quantity in binary register 40. $\omega_p$, as defined by equation (2), therefore varies linearly with the control quantity in register 40.

If register 40 is a binary counter driven by regularly recurring pulses from a clock, the active RC filter of FIG. 3 can be conveniently employed as a swept bandpass filter such as is required in a signal spectrum analyzer, the pass band of the filter moving upward in frequency incrementally as the count in register 40 increases. If, on the other hand, register 40 is controlled by signals from digital computing machinery, the active RC filter of FIG. 3 can be readily employed as a programmable bandpass filter, the pass band of the filter being established by the control quantity in register 40.

It will be understood that, whereas a six stage binary register 40 and resistive networks with six switchable resistors have been illustrated in FIG. 3, a binary register 40 having any number of stages and resistive networks having a corresponding number of switchable resistors can, of course, be employed. As mentioned above, finer adjustments of $\omega_p$ over a greater range are made possible by increasing the number of switchable resistors in each resistive network.

The resistive network of FIG. 2 is also suitable for replacing $R_a$ or $R_d$ in the filter of FIG. 1 to produce linear variation of either bandwidth of peak gain, respectively. This is, of course, because $R_a$ and $R_d$ appear in the denominator of the functions determining bandwidth and peak gain (see equations (3) and (4)). It is also desirable to be able to digitally control resistances appearing in the numerator of such functions so that the characteristics determined thereby can be varied linearly by variation of those resistances. Thus it might be advantageous in a particular application to vary peak gain by varying $R_a$ rather than $R_d$.

Figure 4:
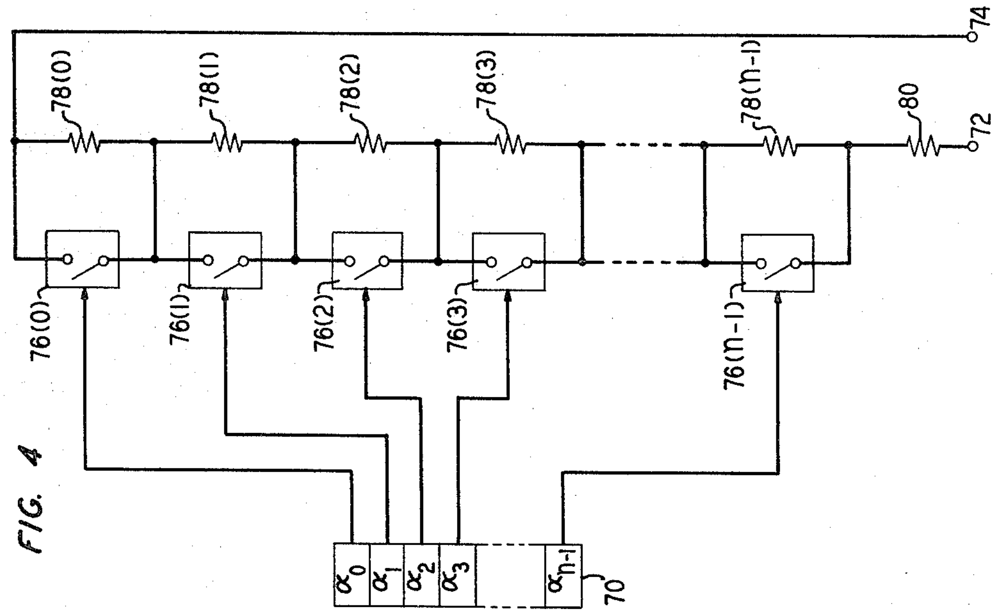
FIG. 4 is a schematic diagram of another type of digitally controlled resistive network for use in active RC filters constructed in accordance with the principles of this invention.

FIG. 4 illustrates a resistive network constructed according to the principles of this invention and having a net resistance measured between terminals 72 and 74 which varies linearly with a binary digital control quantity. The network of FIG. 4 includes a plurality of resistors 78(0) through 78($n$—1) and 80 connected in series between terminals 72 and 74. Each of resistors 78 is shunted by a switch 76 connected in parallel therewith. Each of switches 76 is uniquely controlled by the logical condition of the corresponding place of the binary quantity stored in register 70. Like register 14 in FIG. 2, register 70 may be any suitable n-stage binary counter or storage register. Unlike the network of FIG. 2, however, each of switches 76 is closed, thereby short circuiting the corresponding resistor 78, when the corresponding place of the control quantity is logical zero and open when the corresponding place of the control quantity is logical one. Thus current flows through each of resistors 78(0) through 78($n$—1) only when the corresponding switch is open, the resistor being effectively removed from the network when the corresponding switch is closed.

Since the net resistance of resistors connected in series is given by the sum of the individual resistances, the net resistance of the resistive network of FIG. 4 is given by $$R_t = R_{fixed} + \alpha_0 R_0 + \alpha_2 R_2 + \ldots + \alpha_{n-1} R_{n-1} \qquad (12)$$

where $R_{fixed}$ is the value of resistor 80, the $\alpha_i$ are the binary switching functions defined above in connection with equations (6) and (7), and $R_0$ through $R_{n-1}$ are the values of resistors 78(0) through 78($n$—1), respectively.

In accordance with the principles of this invention, $R_0$ through $R_{n-1}$ are chosen so that they are related by a geometric series having ratio 2, i.e., so that $$R_i = (2)^i R_0 \text{ for } 1 \leq i \leq n-1. \qquad (13)$$

Substituting equation (13) into equation (12) yields $$R_t = R_{fixed} + R_0 \sum_{i=0}^{i=n-1} \alpha_i 2^i \qquad (14)$$

Just as in the case of equation (10), $$\sum_{i=0}^{i=n-1} \alpha_i 2^i$$

is the decimal value of the binary control quantity stored in register 70 responsive to which switches 76(0) through 76($n$—1) operate. Accordingly, $R_t$ varies linearly upward with the binary control quantity starting from a minimum value given by $R_{fixed}$. The network of FIG. 4 is therefore adapted for linear digital control of a resistance. This network is therefore suitable for use in place of any of the resistors in an active RC filter network like that shown in FIG. 1 to produce a linear variation of any filter characteristic having a resistance in the numerator of the governing function (e.g., $R_a$ in equation (4)). Just as in the case of the network of FIG. 2, any precision and/or range of linear adjustment of a resistance can be effected simply by choosing a sufficiently large value of $n$.

It was mentioned above that capacitances as well as resistances can be varied to achieve desired variation in the characteristics of an active RC filter of the type shown in FIG. 1. Thus, as is evident from equation (2), $\omega_p$ for the filter of FIG. 1 can be varied linearly by means of simultaneous linear variation of the inverse or reciprocal of $C_a$ and $C_b$ in a manner analogous to the simultaneous linear variation of the inverse of $R_b$ and $R_c$ discussed above in connection with FIGS. 2 and 3. Similarly, the width of the pass band of the filter of FIG. 1 can be varied linearly by the linear variation of the inverse of $C_a$.

Figure 5:
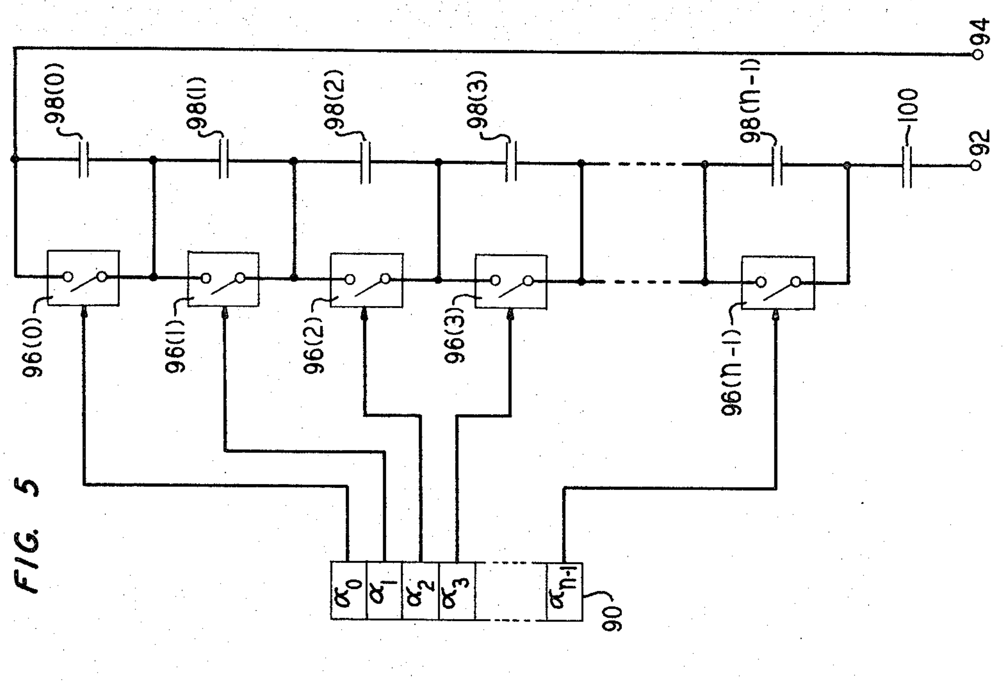
FIG. 5 is a schematic diagram of a digitally controlled capacitive network for use in active RC filters constructed in accordance with the principles of this invention.

Since the reciprocal of capacitance is given by the sum of the reciprocals of capacitances connected in series, a digitally controlled variable reciprocal capacitance can be achieved, in accordance with the principles of this invention, by a network of the type shown in FIG. 5. It will be observed that the capacitive network of FIG. 5, is entirely analogous to the resistive network of FIG. 4 with each resistor replaced by a capacitor. Accordingly, the network of FIG. 5 operates in a manner analoguous to the network of FIG. 4 but is governed by equations of the type discussed in connection with the resistive network of FIG. 2. Thus the reciprocal of the capacitance of the network of FIG. 5 is given by $$1/C_t = 1/C_{fixed} + \alpha_0/C_0 + \alpha_1/C_1 + \alpha_2/C_2 + \ldots + \alpha_{n-1}/C_{n-1} \qquad (15)$$

where $C_{fixed}$ is the value of capacitor 100, the $\alpha_i$ are as defined in connection with equations (6), (7), and (12), and $C_0$ through $C_{n-1}$ are the values of capacitors 98(0) through 98($n$—1), respectively.

To produce the desired linear relationship between the reciprocal of the overall capacitance of the network of FIG. 5 and the binary control quantity stored in register 90, $C_0$ through $C_{n-1}$ are chosen so that their values are related in the same way that the values of resistors 18(0) through 18($n$—1) in the network of FIG. 2 are related, i.e., by a geometric progression with ratio one-half. Thus $$C_i = (1/2)^i C_0 = C_0/2^i \text{ for } 1 \leq i \leq n-1. \qquad (16)$$

Rewriting equation (15) using equation (16) yields $$\frac{1}{C_t} = \frac{1}{C_{fixed}} + \frac{1}{C_0} \sum_{i=0}^{i=n-1} \alpha_i 2^i \qquad (17)$$

in a manner entirely analogous to the derivation of equation (10). The reciprocal of $C_t$ is therefore linearly related to the value of the control quantity stored in register 90

$$\left(\text{i.e., to } \sum_{i=0}^{i=n-1} \alpha_i 2^i\right)$$

) as is required for linear control of the characteristic of active RC filters of the type shown in FIG. 1. The same flexibility inherent in the design of the resistive networks of FIGS. 2 and 4 is present in the design of the capacitive network of FIG. 5. Thus $1/C_{fixed}$ establishes the minimum value of the capacitance of the network, $1/C_0$ determines the proportional constrast between variation of the control quantity and variation of the controlled characteristic, and $n$ establishes the range over which the adjustment can be made.

It is to be understood that the embodiments shown and described herein are illustrative of the principles of this invention only, and that modifications may be implemented by those skilled in the art without departing from the spirit and scope of the invention. For example, although variation of the characteristics of the second order bandpass active RC filter has been used to illustrate application of the principles of the invention, it will be evident that these principles are also applicable to variation of the characteristics of general second order active RC filters. Moreover, since higher order filter functions are customarily realized by the cascade or serial connection of second order active RC filter sections, the principles of this invention are applicable to any filter thus made up of second order filter sections.

What is claimed is:

1. Adjustable active RC filter apparatus for processing signals applied to an input terminal including first, second, and third operational amplifiers, a first network connecting said input terminal and the input terminal of said first operational amplifier, a second network connecting the input and output terminals of said first operational amplifier, a third network connecting the output terminal of said first operational amplifier and the input terminal of said second operational amplifier, a fourth network connecting the input and output terminals of said second operational amplifier, a fifth network connecting the output terminal of said second operational amplifier and the input terminal of said third operational amplifier, a sixth network connecting the input and output terminals of said third operational amplifier, and a seventh network connecting the output terminal of said third operational amplifier and the input terminal of said first operational amplifier wherein at least one of said networks comprises:

variable impedance means including a plurality of $n$, a predetermined number, passive circuit elements, $Z_0, Z_1, Z_2. . . . Z_{(n-1)}$, the impedance values of said passive elements forming a geometric progression, and a plurality of switching elements, $S_0, S_1, S_2....S_{(n-1)}$, each of said switches respectively connected to that one of said passive elements having a corresponding subscript designation to form circuit branches; and, means responsive to the logic level of each particular place within an applied binary control signal for activating that one of said switching elements having an identifying subscript identical to that integer, which is the exponent of the base 2, determining the numerical significance of said particular place of said binary control signal.

2. The apparatus defined in claim 1 wherein said passive circuit elements are connected in series.

3. The apparatus defined in claim 2 wherein the switching element paired with each of said passive circuit elements is connected in parallel with said paired passive circuit element.

4. The apparatus defined in claim 3 wherein each of said passive circuit elements is a resistor.

5. The apparatus defined in claim 3 wherein each of said passive circuit elements is a capacitor.

6. The apparatus defined in claim 1 wherin said passive circuit elements are connected in parallel.

7. The apparatus defined in claim 6 wherein the switching element paired with each of said passive circuit elements is connected in series with said paired passive circuit element.

8. The apparatus defined in claim 7 wherein each of said passive circuit elements is a resistor.

9. Active RC filter apparatus comprising:

a plurality of operational amplifiers connected by circuit networks wherein said circuit networks control the operating characteristics of said active filter and at least one of said circuit networks comprises a plurality of passive circuit elements having a geometric progression of impedance values, each passive circuit element having an associated switching element for selectively controlling the current flow in said passive circuit element; and, control means responsive to a binary control signal for selectively operating said switching elements, said control means uniquely associating each place of said binary control signal with one of said switching elements to activate a particular switching element in response to a predetermined logic level of that place of said binary control signal associated with said particular switching element, said unique association between said binary control signal and said switching elements thereby determining the effective impedance of said network comprising said plurality of associated passive circuit elements and switching elements and linearly relating the decimal value of said binary control signal with the effective impedance of said network.

10. The apparatus defined in claim 9 wherein said passive circuit elements are connected in eries.

11. The apparatus defined in claim 10 wherein the switching element paired with each of said passive circuit elements is connected in parallel with said paired passive circuit element.

12. The apparatus defined in claim 11 wherein each of said passive circuit elements is a resistor.

13. The apparatus defined in claim 11 wherein each of said passive circuit elements is a capacitor.

14. The apparatus defined in claim 9 wherein said passive circuit elements are connected in parallel.

15. The apparatus defined in claim 14 wherein the switching element paired with each of said passive circuit elements is connected in series with said paired passive circuit element.

16. The apparatus defined in claim 15 wherein each of said passife circuit elements is a resistor.

17. Apparatus for controlling at least one of the frequency response characteristics of an active RC filter, such that each of said controlled characteristics is linearly related to the equivalent decimal value of an applied binary control signal, said filter including at least one operational amplifier and a plurality of passive circuit networks wherein the total impedance of at least one of said passive circuit networks is adjustable and under the control of said binary control signal to linearly control each of said controlled characteristics, said adjustable passive network comprising a plurality of ordered passive circuit elements having a geometric progression of impedance values, each passive circuit element having a switching element in circuit relation thereto for selectively preventing current from flowing in said passive circuit element, and control means responsive to the logic level within that place of said applied binary control signal having numerical significance $2^i$ for activating that one of said switching elements in circuit relation with that passive circuit element which occupies the $i^{th}$ position within said geometric progression of impedance values.

18. The apparatus defined in claim 17 wherein said passive circuit elements have a geometric progression of values with ratio one-half.

19. The apparatus defined in claim 17 wherein said passive circuit elements have a geometric progression of values with ratio two.

20. In an active RC filter having at least one controllable frequency characteristic, said filter including first, second, and third operational amplifiers, a first resistive network connecting the filter input terminal and the input terminal of said first operational amplifier, a first feedback network including a second resistive network connecting the input and output terminals of said first operational amplifier, a third resistive network connecting the output terminal of said first operational amplifier and the input terminal of said second operational amplifier, a second feedback network including a fourth resistive network connecting the input and output terminals of said second operational amplifier, a fifth resistive network connecting the output terminal of said second operational amplifier and the input terminal of said third operational amplifier, and a third feedback network including a sixth resistive network connecting the output terminal of said third operational amplifier and the input terminal of said first operational amplifier wherein at least one of said frequency characteristics is controlled by varying the resistance of at least one of said resistive networks, the improvement comprising:

variable resistance network means for controlling said frequency characteristic, including a predetermined number, $n$, of parallel connected circuit branches, each circuit branch including a switching element and a resistor connected in series, said $n$ resistors, $R_0, R_1, R_2, \ldots R_{(n-1)}$, having resistance values $R_0$, $R_0/2$, $R_0/4, \ldots, R_0/2^{n-1}$, and said switching elements, $S_0, S_1, S_2, \ldots S_{(n-1)}$, respectively connected to that resistor having an identical identifying subscript, and means for connecting a source of binary control signals to said switching elements such that the first place of said binary control signal having numerical significance $2^0$ is applied to said first switching element $S_0$, the second place of said binary control signal having significance $2^1$ is applied to said second switching element, $S_1$, and each successive place within said binary control signal having numerical significance $2^i$ is applied to that switching element designated $S_i$.

21. Active RC filter apparatus having at least one frequency characteristic controlled by a binary control signal such that each of said controlled characteristics is linearly related to the equivalent decimal value of said binary control signal, comprising:

first, second, and third operational amplifiers, a first resistive network connecting said input terminal and the input terminal of said first operational amplifier, a first feedback network including a second resistive network connecting the input and output terminals of said first operational amplifier, a third resistive network connecting the output terminal of said first operational amplifier and the input terminal of said second operational amplifier, a second feedback network including a fourth resistive network connecting the input and output terminals of said second operational amplifier, a fifth resistive network connecting the output terminal of said second operational amplifier and the input terminal of said third operational amplifier, and a third feedback network including a sixth resistive network connecting the output terminal of said third operational amplifier and the input terminal of said first operational amplifier, at least one of said resistive networks being a variable resistance network comprising an ordered set of $n$ resistors, $R_0$, $R_1$, $R_2, \ldots R_{n-1}$, said resistance $R_0$ having a predetermined value and each one of said remaining resistors having a resistance value twice as great as that resistor immediately preceding said particular resistor in said ordered set, and an ordered set of $n$ switching means $S_0$, $S_1$, $S_2, \ldots S_{n-1}$, each of said switching means responsive to the logical condition of a predetermined place of a binary control signal, switching means $S_0$ connected in parallel with said resistor $R_0$, switching means $S_1$ connected in parallel with said resistor $R_1$, and each of the remaining switching means, $S_i$, connected in parallel with its corresponding resistor, $R_i$, means for serially connecting each of said $n$ parallel connecting switch means and resistors, and means for supplying said binary control signal to said switching means, that place of said binary control signal having numerical significance $2^0$ supplied to switching means $S_0$, that place of said binary control signal having numerical significance $2^1$ supplied to switching means $S_1$, and each remaining place of said binary control signal having numerical significance $2^i$ supplied to switching means $S_i$.

22. Active RC bandpass filter apparatus having a center frequency controlled by a binary input signal such that said center frequency is linearly related to the decimal value of said binary input signal, comprising:

first, second, and third operational amplifiers;

first, second, and third feedback networks, said first feedback network connected between the input and output terminals of said first amplifier, said second feedback network connected between the input and output terminals of said second amplifier, and said third feedback network connected between the input and output terminals of said third amplifier;

first and second resistive networks, said first resistive network connected between the input terminal of said filter apparatus and the input of said first amplifier, said second resistive network connected between the output of said first amplifier and the input of said second amplifier;

first and second variable impedance means, said first variable impedance means connected between the output of said second amplifier and the input of said third amplifier, said second variable impedance means connected between the output of said third amplifier and the input of said first amplifier, each of said first and second variable impedance means comprising a predetermined number, $n$, of parallel connected circuit branches including a serially connected resistor and switching means, said switching means responsive to the logical condition of a predetermined place in said binary control signal, the resistance value of said resistor in the first one of said *n* circuit branches being a predetermined value $R_o$, the resistance value of said resistor in the second one of said *n* circuit branches being $R_o/2$, the resistance value of said resistor in a third one of said *n* circuit branches being $R_o/4$, the resistance value of each of said remaining resistors being such that the *n* resistor values form the geometric progression $R_o, R_{o/2}, R_{o/4}, \ldots, R_{o/2^{(n-1)}}$;

a plurality of *n* means for connecting said binary control signal to said switching means, the first one of said connecting means connecting that place of said binary control signal having numerical significance $2^0$ to that switching means connected in series with said resistor of predetermined value $R_o$, the second one of said connecting means connecting that place of said binary control signal having numerical significance $2^1$ to that switching means in series with said resistor of value $R_o/2$, each remaining connecting means separately connecting that place of said binary control signal having numerical significance $2^i$ to that switching element in series with that resistor having value $R_o/_i$.

23. The apparatus defined in claim 22 wherein said binary control signal is supplied by a source of signal pulses including a counter for counting said pulses in the base two number system.

* * * * *